US011069850B2

(12) United States Patent
Kumura

(10) Patent No.: US 11,069,850 B2
(45) Date of Patent: Jul. 20, 2021

(54) MAGNETIC MEMORY DEVICE AND MANUFACTURING METHOD OF THE SAME

(71) Applicant: TOSHIBA MEMORY CORPORATION, Tokyo (JP)

(72) Inventor: Yoshinori Kumura, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/568,050

(22) Filed: Sep. 11, 2019

(65) Prior Publication Data

US 2020/0303627 A1 Sep. 24, 2020

(30) Foreign Application Priority Data

Mar. 18, 2019 (JP) ............................. JP2019-049888

(51) Int. Cl.
*H01F 10/32* (2006.01)
*H01L 43/02* (2006.01)
(Continued)

(52) U.S. Cl.
CPC ........... *H01L 43/02* (2013.01); *H01F 10/329* (2013.01); *H01L 27/224* (2013.01);
(Continued)

(58) Field of Classification Search
CPC . H01F 10/329; H01F 10/3295; H01F 10/3231
See application file for complete search history.

(56) References Cited

U.S. PATENT DOCUMENTS

| | | | | |
|---|---|---|---|---|
| 7,190,613 | B2 | 3/2007 | Nagase et al. | |
| 2006/0220084 | A1* | 10/2006 | Umehara ............... | B82Y 10/00 257/296 |

(Continued)

FOREIGN PATENT DOCUMENTS

| | | | |
|---|---|---|---|
| JP | 2000195250 | A | 7/2000 |
| JP | 2005019464 | A | 1/2005 |
| JP | 2011171454 | A | 9/2011 |

OTHER PUBLICATIONS

"Magnetic tunnel junction device, operation in the unprecedented single-digit nanometer range-Path to realization of ultra-high capacity, low power consumption, high-performance nonvolatile memory—", Feb. 15, 2018, Tohoku University, 2 pages, downloaded from: <https://www.tohoku.ac.jp/japanese/2018/02/press20180214-01.html>.

(Continued)

*Primary Examiner* — Jarrett J Stark
(74) *Attorney, Agent, or Firm* — Holtz, Holtz & Volek PC

(57) ABSTRACT

According to one embodiment, a magnetic memory device includes a stacked structure including a first magnetic layer having a fixed magnetization direction, a nonmagnetic layer provided on the first magnetic layer, and a second magnetic layer provided on the nonmagnetic layer and having a variable magnetization direction, a first insulating layer provided along a side surface of the stacked structure and having an upper end located at a position lower than an upper end of the side surface of the stacked structure, and a second insulating layer covering the first insulating layer and having an upper end located at a position higher than the upper end of the first insulating layer.

6 Claims, 12 Drawing Sheets

(51) Int. Cl.
*H01L 43/12* (2006.01)
*H01L 27/22* (2006.01)

(52) U.S. Cl.
CPC ............ *H01L 27/228* (2013.01); *H01L 43/12* (2013.01); *H01F 10/3231* (2013.01); *H01F 10/3295* (2013.01)

(56) References Cited

U.S. PATENT DOCUMENTS

| | | | | |
|---|---|---|---|---|
| 2007/0181964 | A1* | 8/2007 | Shoji | G11C 11/16 257/421 |
| 2010/0096716 | A1* | 4/2010 | Ranjan | B82Y 10/00 257/421 |
| 2011/0076784 | A1* | 3/2011 | Druist | H01L 43/12 438/3 |
| 2013/0026585 | A1* | 1/2013 | Sung | H01L 43/08 257/421 |
| 2014/0087483 | A1* | 3/2014 | Ohsawa | H01J 37/3053 438/3 |
| 2014/0175582 | A1* | 6/2014 | Apalkov | G11C 11/1675 257/425 |
| 2015/0263267 | A1* | 9/2015 | Kanaya | H01L 21/3213 257/421 |
| 2015/0294703 | A1* | 10/2015 | Apalkov | G11C 11/161 365/158 |
| 2015/0295167 | A1* | 10/2015 | Apalkov | H01L 43/08 257/421 |
| 2015/0372225 | A1* | 12/2015 | Gaidis | G11C 11/161 257/421 |
| 2016/0197268 | A1* | 7/2016 | Yakabe | H01L 43/12 257/421 |
| 2016/0225981 | A1* | 8/2016 | Deshpande | H01L 43/12 |
| 2016/0284761 | A1* | 9/2016 | Zhou | H01L 23/552 |
| 2016/0380183 | A1* | 12/2016 | Chuang | H01L 43/12 257/421 |
| 2018/0233659 | A1* | 8/2018 | Matsumoto | H01L 27/222 |
| 2018/0358065 | A1* | 12/2018 | Hu | H01L 43/12 |
| 2018/0358547 | A1* | 12/2018 | Yang | H01L 27/224 |
| 2019/0103552 | A1* | 4/2019 | Shiokawa | H01F 10/3286 |
| 2019/0206464 | A1* | 7/2019 | Tzoufras | H01F 10/3254 |
| 2019/0207087 | A1* | 7/2019 | Boone | H01L 43/10 |
| 2020/0006628 | A1* | 1/2020 | O'Brien | H01F 41/302 |
| 2020/0006635 | A1* | 1/2020 | Rahman | H01L 27/228 |
| 2020/0006638 | A1* | 1/2020 | Chen | H01L 43/02 |
| 2020/0091411 | A1* | 3/2020 | Sonoda | H01L 43/10 |
| 2020/0106006 | A1* | 4/2020 | Boone | H01L 43/02 |
| 2020/0161542 | A1* | 5/2020 | Ahn | H01F 41/307 |
| 2020/0302987 | A1* | 9/2020 | Sawada | H01L 43/08 |
| 2020/0343299 | A1* | 10/2020 | Hsu | H01L 27/228 |
| 2020/0350494 | A1* | 11/2020 | Dutta | H01L 27/222 |

OTHER PUBLICATIONS

"Sub-10nm thermally stable Perpendicular Shape Anisotropy STT-MRAM realized at SPINTEC", 2015, 4 pages, SPINTEC, downloaded from: <http://www.spintec.fr/sub-10nm-thermally-stable-perpendicular-shape-anisotropy-stt-mram-realized-spintec/>.

Perrissin, et al., "Highly thermally stable sub-20nm magnetic random-access memory based on perpendicular shape anisotropy", Mar. 7, 2018, 15 pages, downloaded from <https://arxiv.org/ftp/arxiv/papers/1803/1803.02663.pdf>.

Watanabe, et al., "Shape anisotropy revisited in single-digit nanometer magnetic tunnel junctions", Nature Communications, vol. 9, No. 663, 2018, pp. 1-6.

* cited by examiner

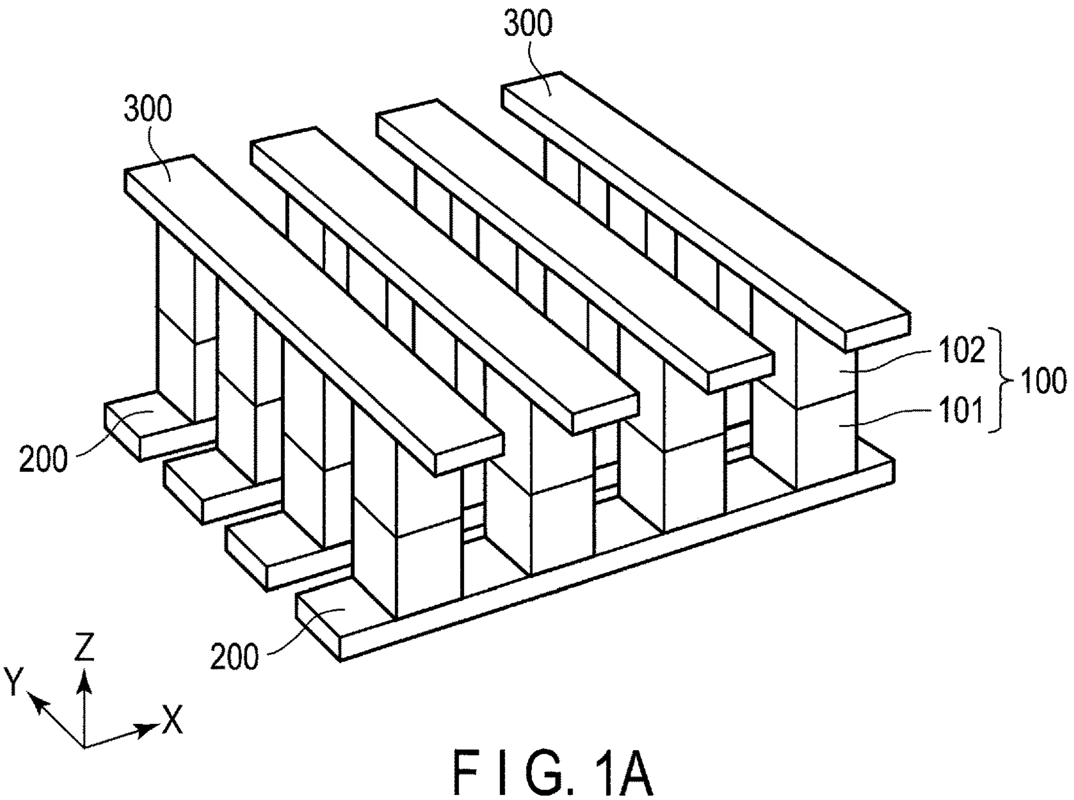
F I G. 1A
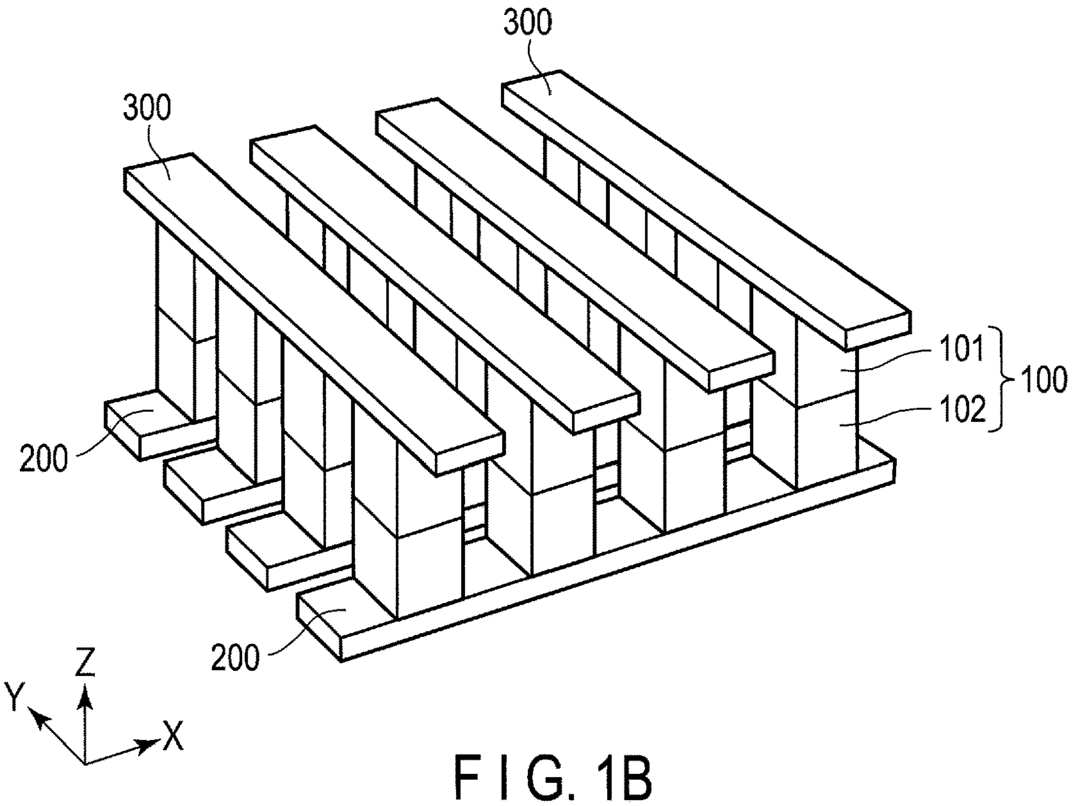
F I G. 1B

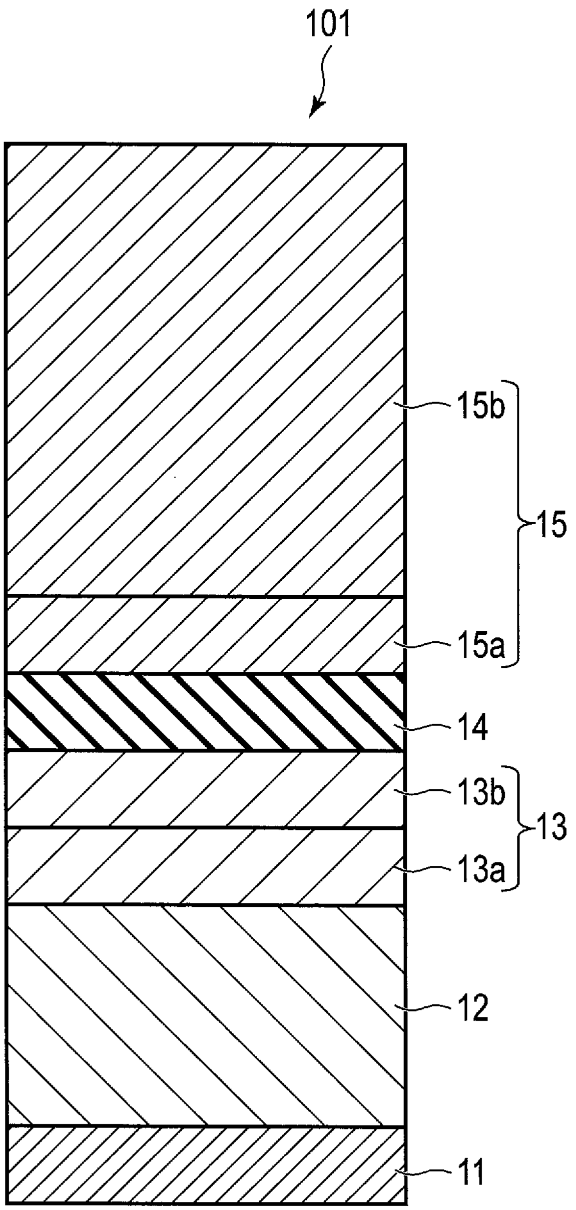
F I G. 2

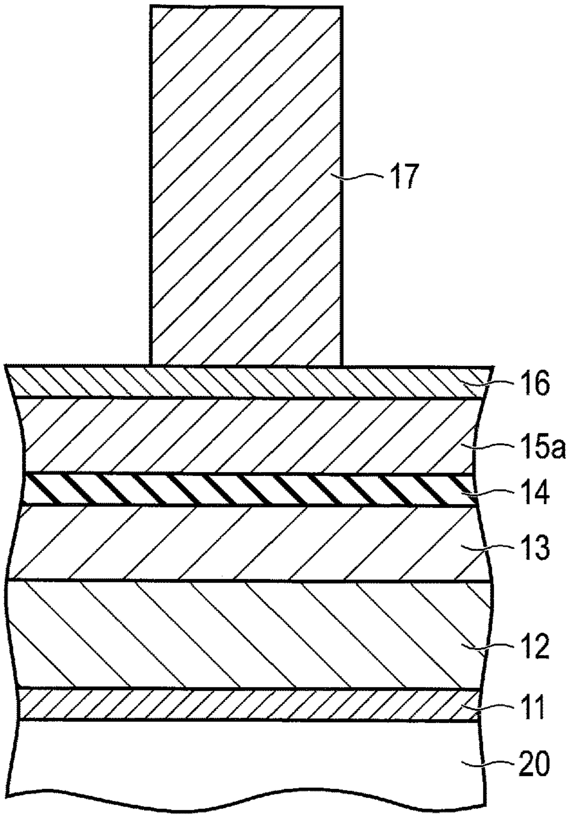
F I G. 3
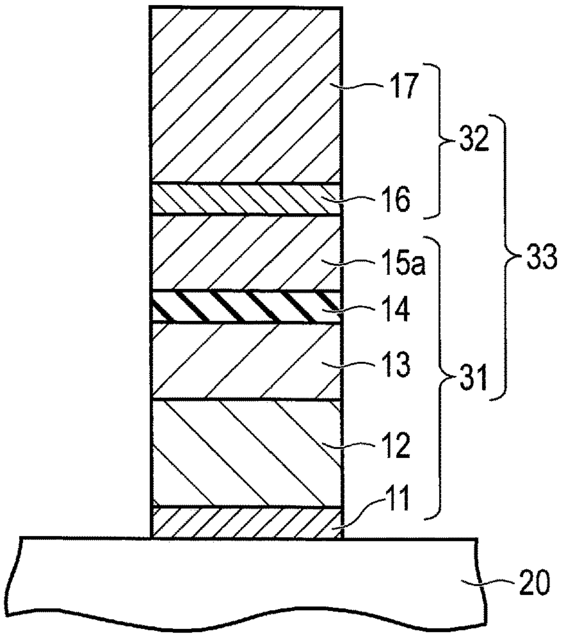
F I G. 4

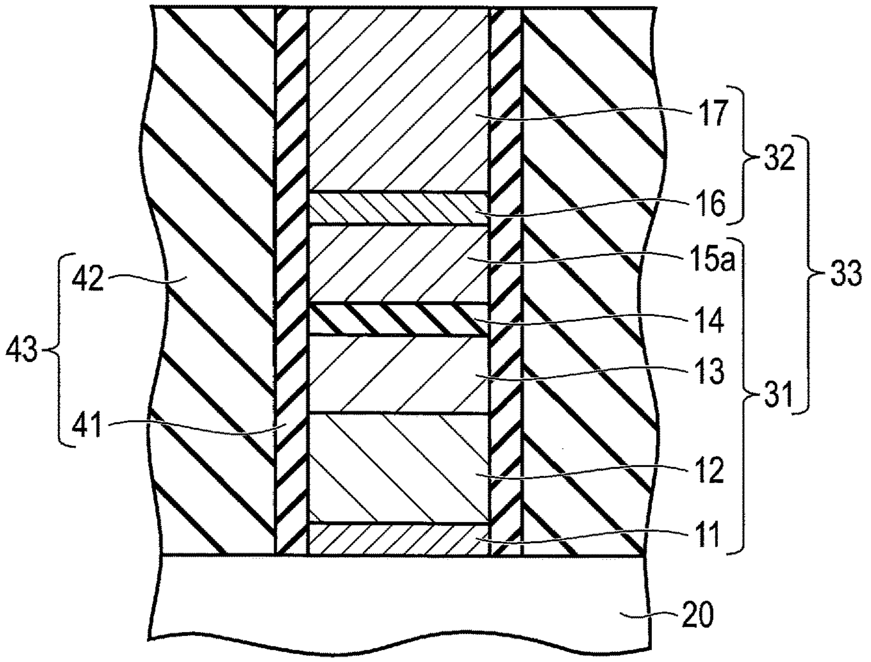
F I G. 5
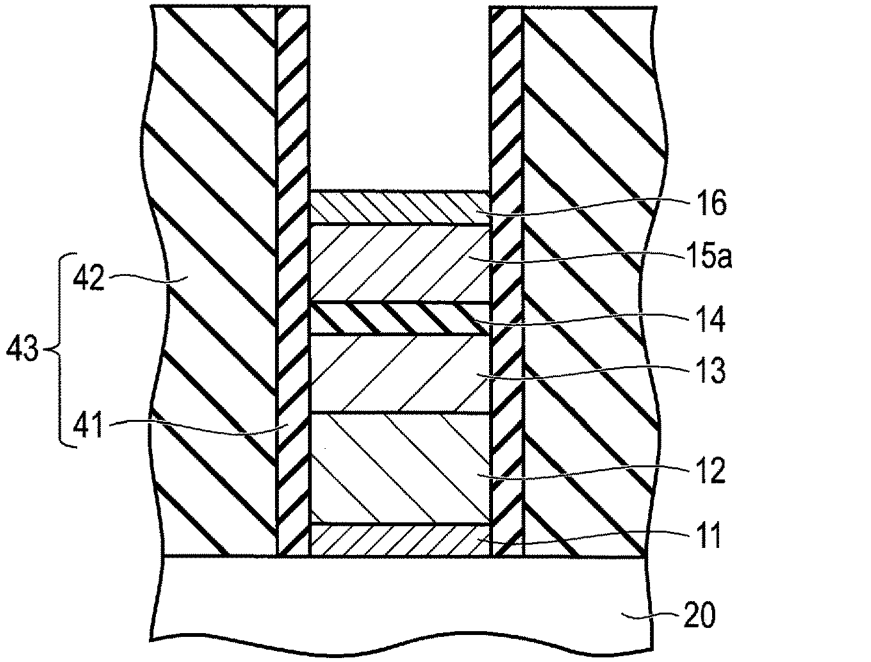
F I G. 6

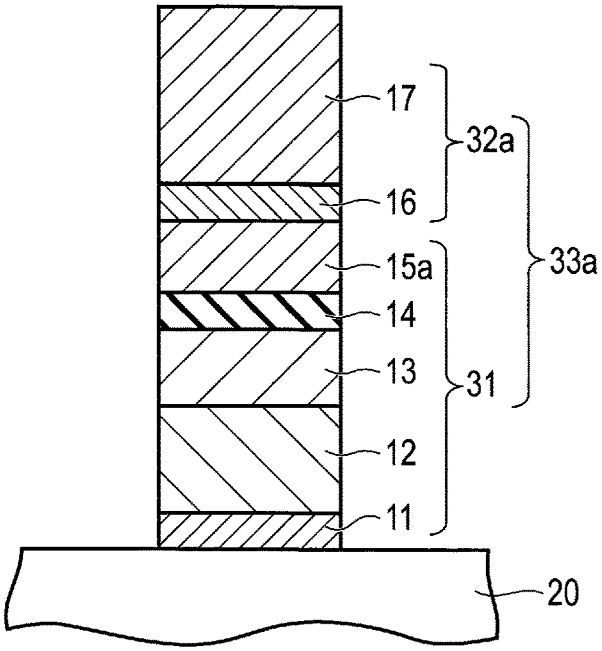
F I G. 11
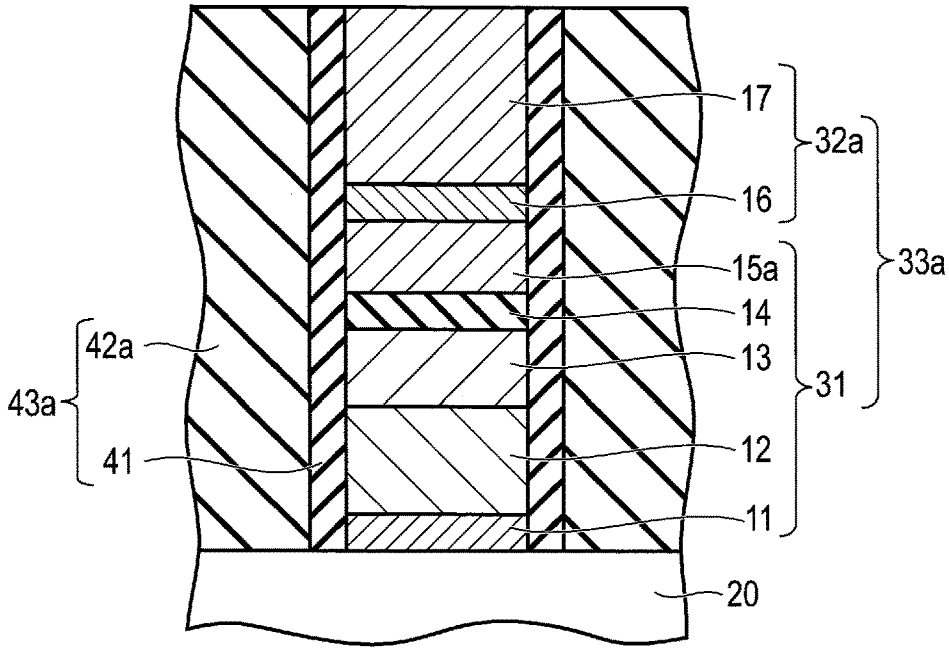
F I G. 12

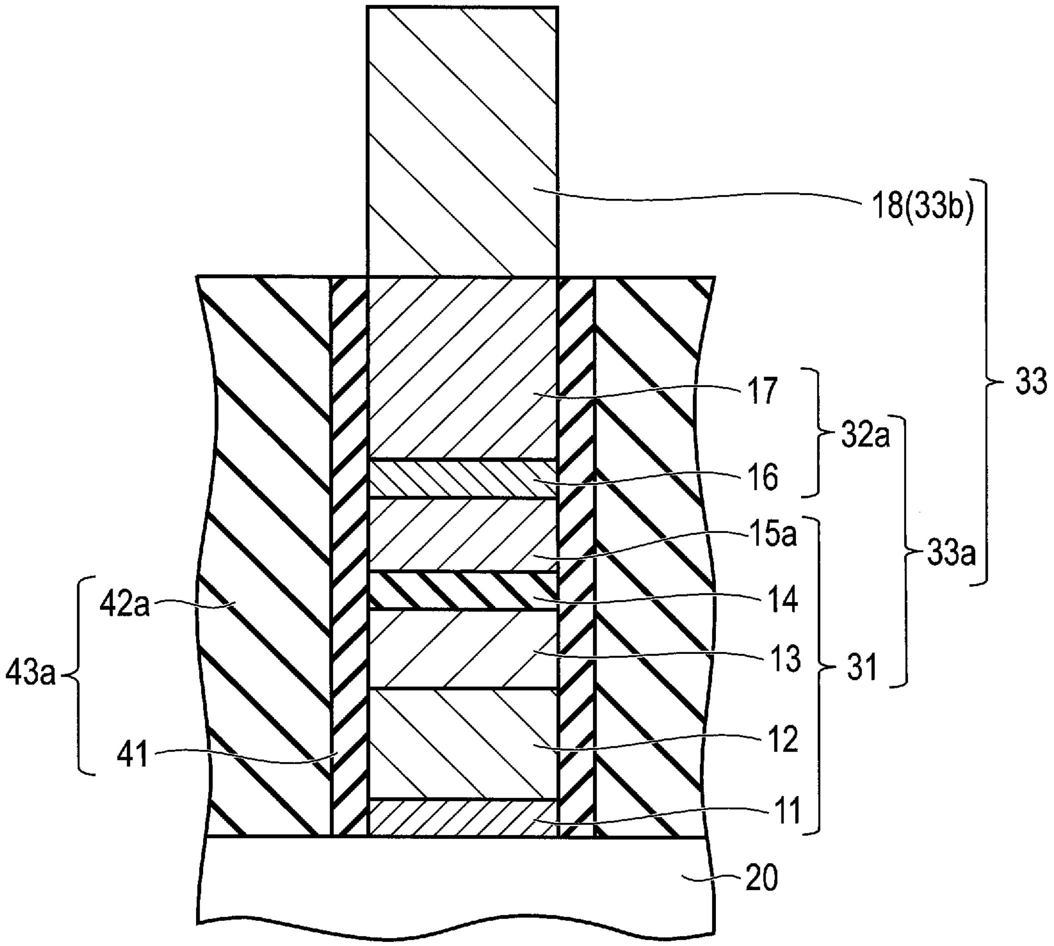
F I G. 13

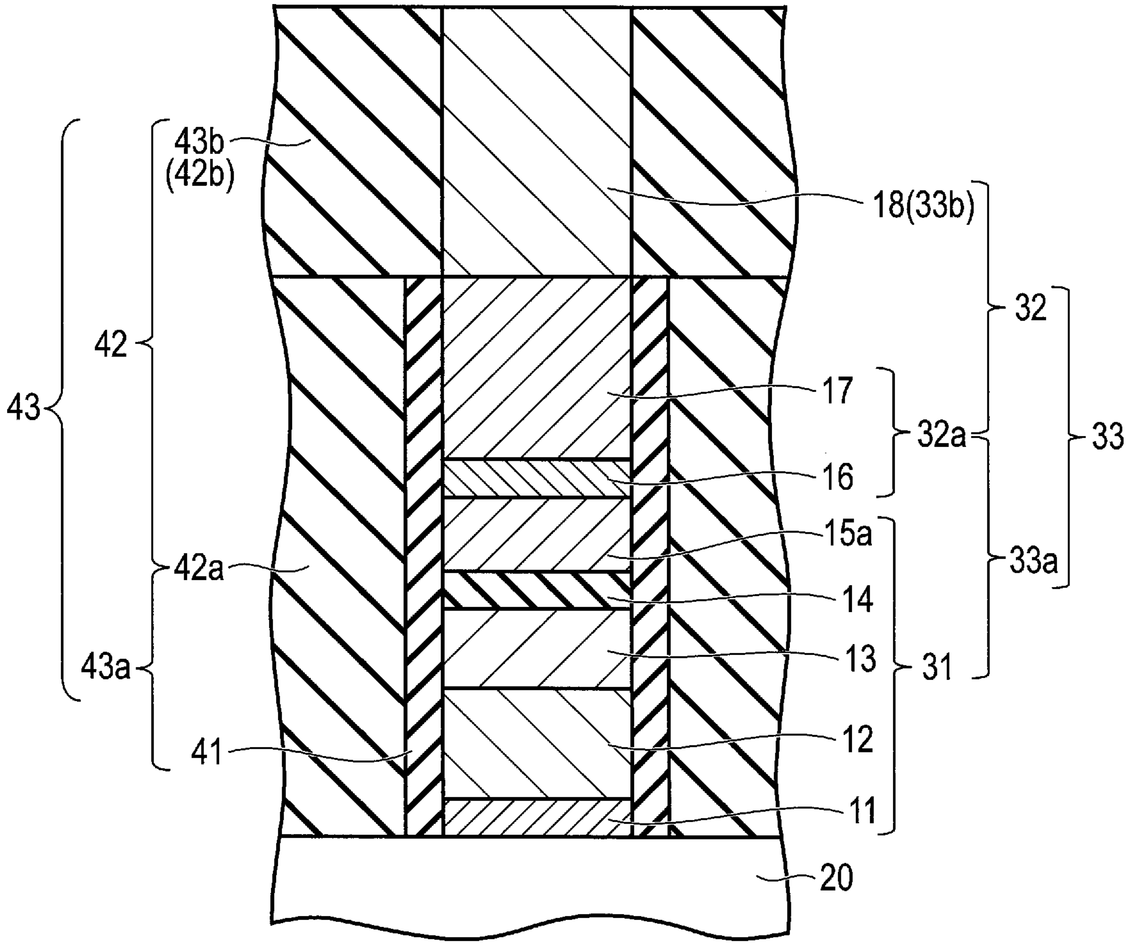
F I G. 14

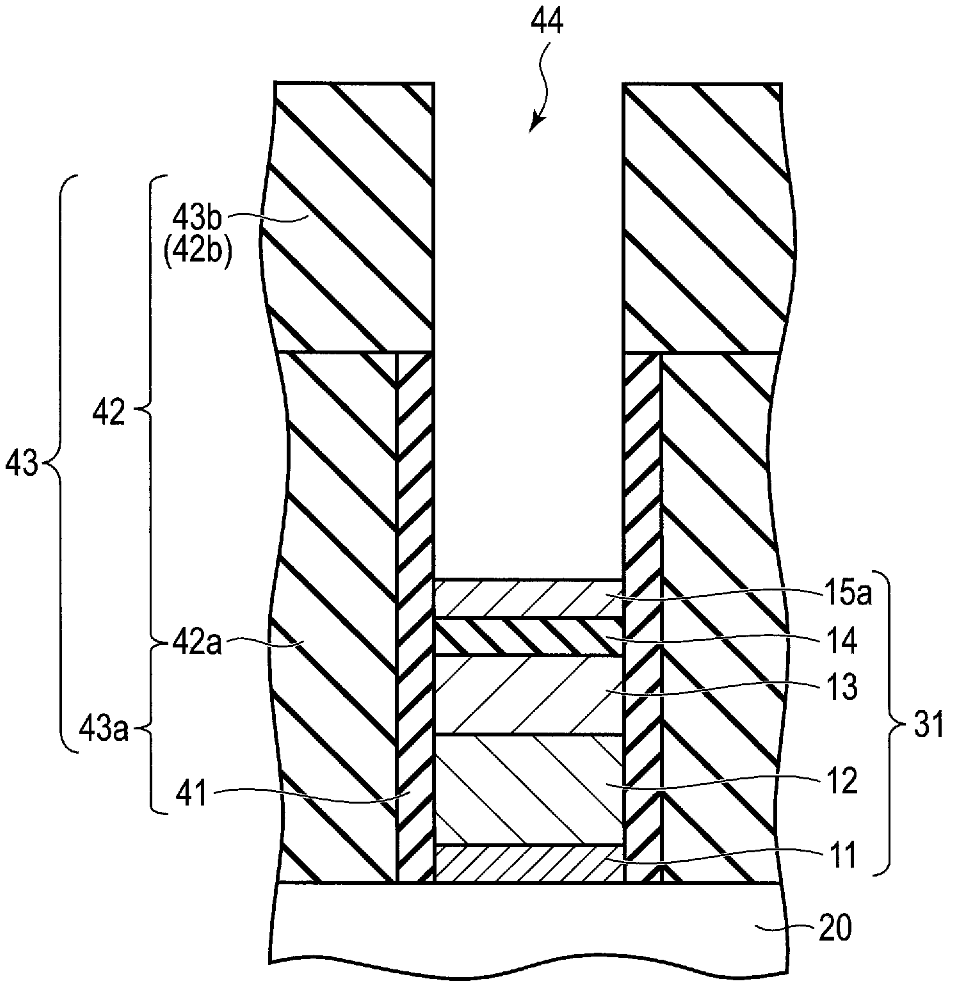
F I G. 15

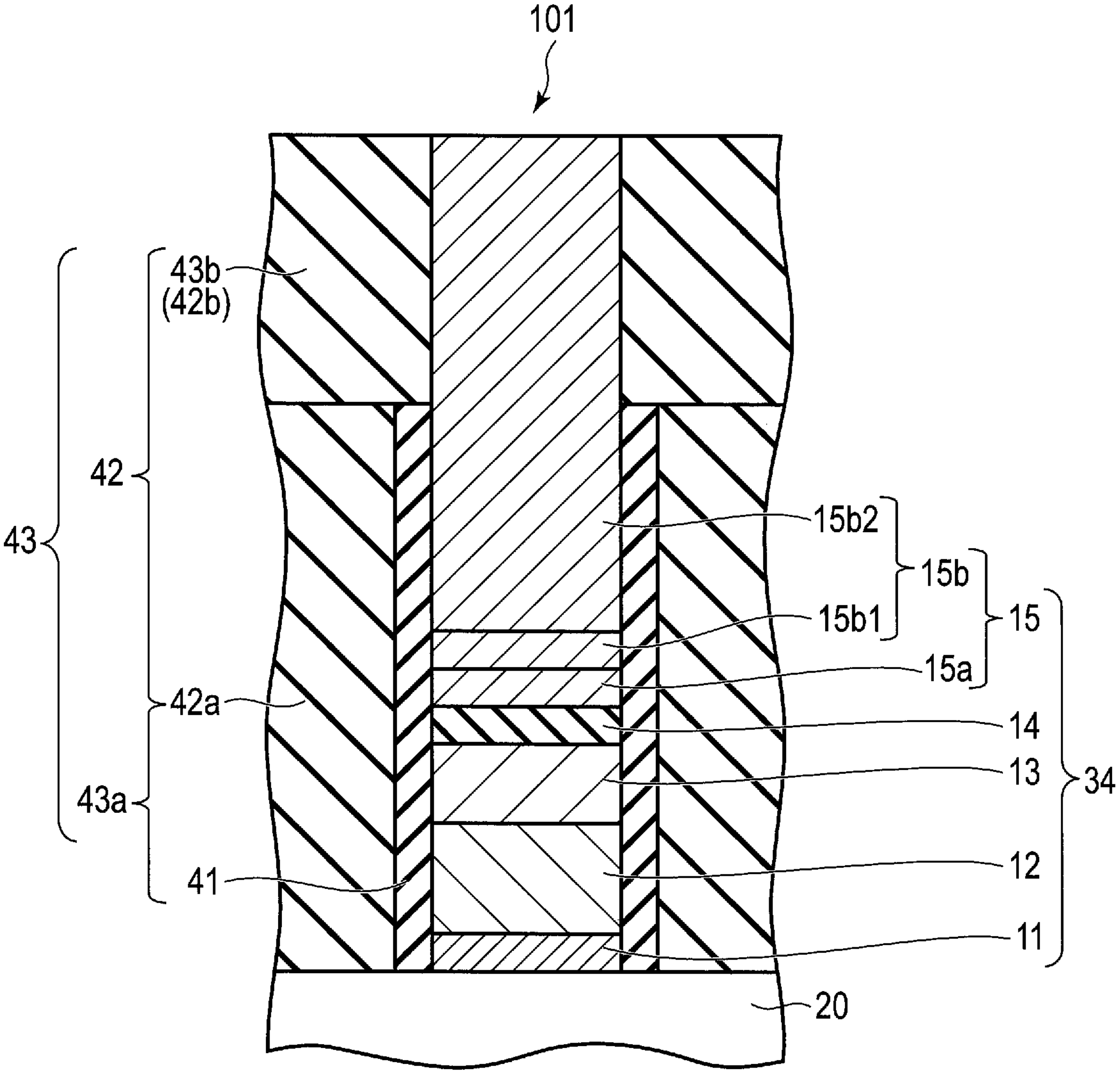
F I G. 17

MAGNETIC MEMORY DEVICE AND MANUFACTURING METHOD OF THE SAME

CROSS-REFERENCE TO RELATED APPLICATIONS

This application is based upon and claims the benefit of priority from Japanese Patent Application No. 2019-049888, filed Mar. 18, 2019, the entire contents of which are incorporated herein by reference.

FIELD

Embodiments described herein relate generally to a magnetic memory device and a manufacturing method of the same.

BACKGROUND

Magnetic memory devices comprising magnetoresistive elements are known.

BRIEF DESCRIPTION OF THE DRAWINGS

FIG. 1A is a perspective view schematically illustrating a configuration of a magnetic memory device according to a first embodiment.

FIG. 1B is a perspective view schematically illustrating another configuration of the magnetic memory device according to the first embodiment.

FIG. 2 is a cross-sectional view schematically illustrating a configuration of a magnetoresistive element according to the first embodiment.

FIG. 3 is a cross-sectional view schematically illustrating in part a method of manufacturing the magnetic memory device according to the first embodiment.

FIG. 4 is a cross-sectional view schematically illustrating in part the method of manufacturing the magnetic memory device according to the first embodiment.

FIG. 5 is a cross-sectional view schematically illustrating in part the method of manufacturing the magnetic memory device according to the first embodiment.

FIG. 6 is a cross-sectional view schematically illustrating in part the method of manufacturing the magnetic memory device according to the first embodiment.

FIG. 11 is a cross-sectional view schematically illustrating in part a method of manufacturing a magnetic memory device according to a second embodiment.

FIG. 12 is a cross-sectional view schematically illustrating in part a method of manufacturing a magnetic memory device according to a second embodiment.

FIG. 13 is a cross-sectional view schematically illustrating in part a method of manufacturing a magnetic memory device according to a second embodiment.

FIG. 14 is a cross-sectional view schematically illustrating in part a method of manufacturing a magnetic memory device according to a second embodiment.

FIG. 15 is a cross-sectional view schematically illustrating in part a method of manufacturing a magnetic memory device according to a second embodiment.

FIG. 17 is a cross-sectional view schematically illustrating a configuration of a magnetic memory device according to a third embodiment.

DETAILED DESCRIPTION

Figure 7:
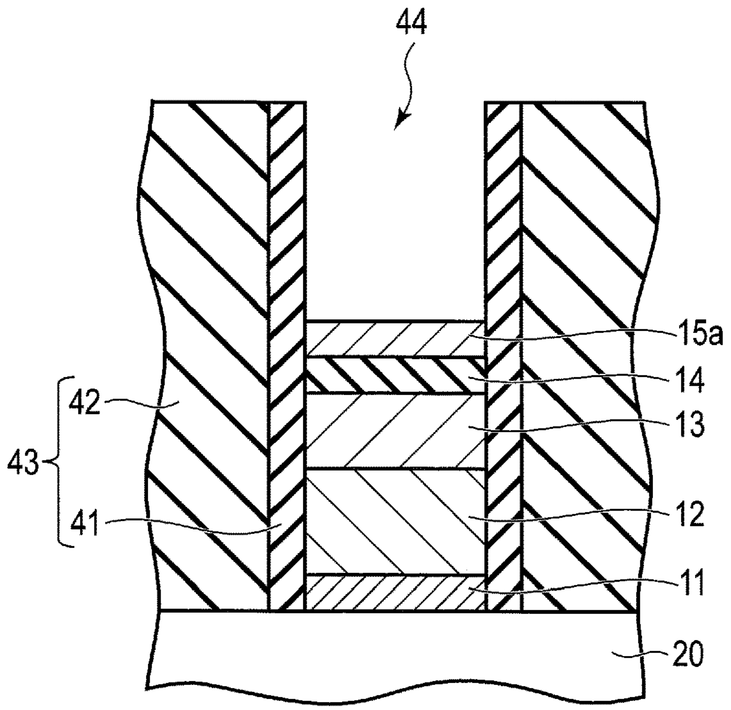
FIG. 7 is a cross-sectional view schematically illustrating in part the method of manufacturing the magnetic memory device according to the first embodiment.

In general, according to one embodiment, a magnetic memory device includes: a stacked structure including a first magnetic layer having a fixed magnetization direction, a nonmagnetic layer provided on the first magnetic layer, and a second magnetic layer provided on the nonmagnetic layer and having a variable magnetization direction; a first insulating layer provided along a side surface of the stacked structure and having an upper end located at a position lower than an upper end of the side surface of the stacked structure; and a second insulating layer covering the first insulating layer and having an upper end located at a position higher than the upper end of the first insulating layer.

Embodiments will be described hereinafter with reference to the accompanying drawings.

First Embodiment

FIG. 1A is a perspective view schematically illustrating a configuration of a magnetic memory device (semiconductor integrated circuit apparatus) according to the first embodiment.

As illustrated in FIG. 1A, the magnetic memory device according to the present embodiment is a magnetic memory device provided with a plurality of memory cells 100 between a plurality of lower interconnects 200 and a plurality of upper interconnects 300. Each memory cell 100 has a configuration in which a magnetoresistive element 101 and a two-terminal selector element 102 comprising a switching function are connected in series. More specifically, the memory cell 100 has a structure in which the selector element 102 is provided on the magnetoresistive element 101. One-side ends of the lower interconnects 200 and the upper interconnects 300 correspond to word lines, and the other side ends of the lower interconnects 200 and the upper interconnects 300 correspond to bit lines. As an example of the selector element, two-terminal switching element comprising the switching function has been explained but, for example, a three-terminal select transistor may be used as the switching element.

The selector element 102 is provided on the magnetoresistive element 101, in the magnetic memory device illustrated in FIG. 1A, but the magnetoresistive element 101 may be provided on the selector element 102 as illustrated in FIG. 1B.

FIG. 2 is a cross-sectional view schematically illustrating a configuration of the magnetoresistive element 101 used in the magnetic memory device illustrated in FIG. 1A and FIG. 1B. The magnetoresistive element is also called a magnetic tunnel junction (MTJ) element.

The magnetoresistive element 101 illustrated in FIG. 2 includes an under layer 11, a shift canceling layer 12 provided on the under layer 11, a reference layer (first magnetic layer) 13 provided on the shift canceling layer 12, a tunnel barrier layer (nonmagnetic layer) 14 provided on the reference layer 13, and a storage layer (second magnetic layer) 15 provided on the tunnel barrier layer 14.

The storage layer (second magnetic layer) 15 has a variable magnetization direction. The variable magnetization direction indicates that the magnetization direction changes with respect to a predetermined write current. The storage layer 15 contains iron (Fe), cobalt (Co), and boron (B). In addition, the storage layer 15 of the present embodiment has perpendicular magnetization, and includes a lower layer part 15*a* formed of a ferromagnetic material and an upper layer part 15*b* provided on the lower layer part 15*a* and formed of a ferromagnetic material.

The reference layer (first magnetic layer) 13 has a fixed magnetization direction. The fixed magnetization direction indicates that the magnetization direction does not change with respect to a predetermined write current. The reference layer 13 has perpendicular magnetization, and includes a lower layer part 13*a* formed of a ferromagnetic material and an upper layer part 13*b* provided on the lower layer part 13*a* and formed of a ferromagnetic material. The lower layer part 13*a* contains cobalt (Co) and at least one element selected from platinum (Pt), nickel (Ni), and palladium (Pd). The upper layer part 13*b* contains iron (Fe), cobalt (Co), and boron (B).

The tunnel barrier layer (nonmagnetic layer) 14 is an insulating layer provided between the reference layer 13 and the storage layer 15. The tunnel barrier layer 14 contains magnesium (Mg) and oxygen (O).

The shift canceling layer 12 has a fixed magnetization direction antiparallel to the magnetization direction of the reference layer 13, and comprises a function of canceling a magnetic field applied from the reference layer 13 to the storage layer 15. The shift canceling layer 12 contains cobalt (Co) and at least one element selected from platinum (Pt), nickel (Ni), and palladium (Pd).

The above-described magnetoresistive element is a spin transfer torque (STT) magnetoresistive element and has perpendicular magnetization. That is, the magnetization direction of the storage layer 15 is a direction perpendicular to its main surface, the magnetization direction of the reference layer 13 is a direction perpendicular to its main surface, and the magnetization direction of the shift canceling layer 12 is a direction perpendicular to its main surface.

The above-described magnetoresistive element has a low resistance state in which the magnetization direction of the storage layer 15 is parallel to the magnetization direction of the reference layer 13, and a high resistance state in which the magnetization direction of the storage layer 15 is antiparallel to the magnetization direction of the reference layer 13. The magnetoresistive element can therefore store binary data (0 or 1) in accordance with the resistance state (low resistance state or high resistance state). In addition, the low resistance state or high resistance state is set in the magnetoresistive element in accordance with the direction of the current flowing in the magnetoresistive element.

As the selector element 102 illustrated in FIG. 1A and FIG. 1B, a two-terminal switching element having a nonlinear voltage-current characteristic and comprising a switching function is used. For example, a diode or a two-terminal switching element containing a chalcogen can be used.

The two-terminal switching element containing a chalcogen is in a high resistance state (for example, an electrically nonconductive state) if a voltage applied between two terminals is smaller than a threshold voltage. The two-terminal switching element is in a low resistance state (for example, an electrically conductive state) if a voltage applied between two terminals is larger than a threshold voltage. The two-terminal switching element may comprise the above-described function for both directions. The above-described switching element may contain at least one chalcogen element selected from a group consisting of Te, Se, and S. Alternatively, the switching element may contain a compound containing these chalcogen elements, i.e., chalcogenide. The above-described switching element may contain at least one element selected from a group consisting of B, Al, Ga, In, C, Si, Ge, Sn, As, P, and Sb. For example, a three-terminal select transistor may be used as the switching element, instead of the two-terminal switching element comprising the switching function.

Next, a method of manufacturing the magnetic memory device according to the present embodiment will be explained. FIG. 3 to FIG. 9 are cross-sectional views schematically illustrating a method of manufacturing the magnetic memory device of the present embodiment.

First, a stacked film is formed on a lower region 20 as illustrated in FIG. 3. The lower region 20 includes a semiconductor substrate, a MOS transistor for peripheral circuit, interconnects such as word lines, an interlayer insulating film, and the like. The stacked film includes the under layer 11, the shift canceling layer 12, the reference layer (first magnetic layer) 13, the tunnel barrier layer (nonmagnetic layer) 14, the lower layer part 15*a* of the storage layer (second magnetic layer), and a cap layer 16. A total thickness of the under layer 11, the shift canceling layer 12, and the reference layer 13 is approximately 10 nm, a thickness of the tunnel barrier layer 14 is approximately 1 nm, and a thickness of the lower layer part 15*a* of the storage layer is approximately 5 nm. The cap layer 16 is formed of a tantalum (Ta) layer having a thickness of approximately 2 nm. Furthermore, a hard mask pattern 17 is formed on the cap layer 16. A ruthenium (Ru) layer having a thickness of approximately 30 nm is used as the hard mask pattern 17.

Next, the above stacked film is etched by ion beam etching (IBE) using the hard mask pattern 17 as a mask as illustrated in FIG. 4. At this time, the hard mask pattern 17 is also etched and the thickness of the hard mask pattern 17 becomes approximately 12 nm. Thus, a preliminary stacked structure 33 including a first stacked portion 31 and a second stacked portion 32 provided on the first stacked portion 31 is obtained. The first stacked portion 31 includes the under layer 11, the shift canceling layer 12, the reference layer 13, the tunnel barrier layer 14, and the lower layer part 15*a* of the storage layer. The second stacked portion 32 includes the cap layer 16 and the hard mask pattern 17.

Next, an insulating structure 43 surrounding the preliminary stacked structure 33 is formed as illustrated in FIG. 5. More specifically, first, a first insulating layer 41 and a second insulating layer 42 are sequentially stacked to cover the preliminary stacked structure 33. A silicon nitride film is used as the first insulating layer 41, and a silicon oxide film is used as the second insulating layer 42. Next, planarization is performed by chemical mechanical polishing (CMP). The insulating structure 43 including the first insulating layer 41 provided along a side surface of the stacked structure and the second insulating layer 42 covering the side surface of the first insulating layer 41 can be obtained by the planarization. An upper surface of the preliminary stacked structure 33 has substantially the same height as an upper surface of the insulating structure 43.

Next, the hard mask pattern 17 is removed by reactive ion etching (RIE) as illustrated in FIG. 6. At this time, the hard mask pattern (Ru layer pattern) 17 can be selectively etched with respect to the cap layer (Ta layer) 16 by using mixture gas of $Cl_2$ and $O_2$.

Next, the cap layer 16 is removed by sputter etching as illustrated in FIG. 7. At this time, the lower layer part 15*a* of the storage layer is also removed and the thickness of the lower layer part 15*a* of the storage layer is reduced to approximately 2 nm. Thus, the second stacked portion 32 is removed and a hole 44 is formed in the insulating structure 43.

Figure 8:
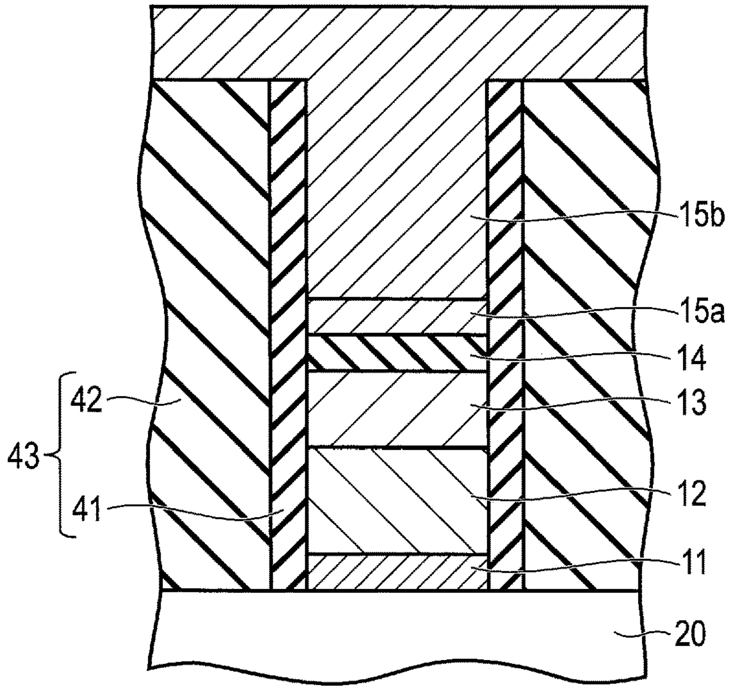
FIG. 8 is a cross-sectional view schematically illustrating in part the method of manufacturing the magnetic memory device according to the first embodiment.

Next, a material for the storage layer is formed on the entire surface by sputtering or plating to form the upper layer part 15*b* of the storage layer as illustrated in FIG. 8.

Figure 9:
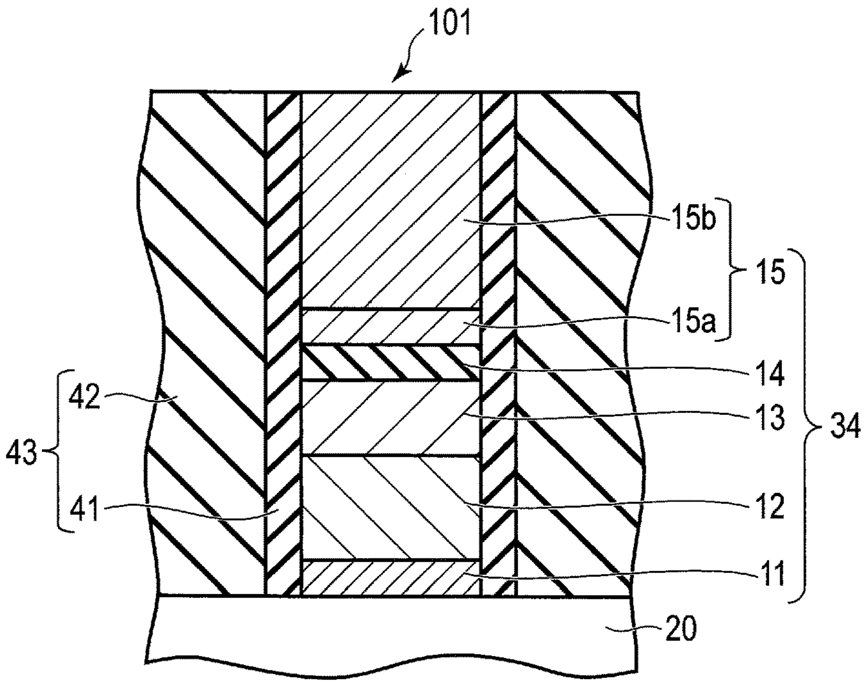
FIG. 9 is a cross-sectional view schematically illustrating in part the method of manufacturing the magnetic memory device according to the first embodiment.

Next, planarization is performed by CMP or IBE as illustrated in FIG. 9. The upper layer part 15*b* of the storage layer is thereby formed in the hole 44. The stacked structure 34 of the magnetoresistive element 101 is thus formed in the insulating structure 43. That is, the stacked structure 34 including the under layer 11, the shift canceling layer 12, the reference layer 13, the tunnel barrier layer 14, and the storage layer 15 can be obtained.

Subsequent steps are not illustrated, but bit lines and the like are formed on the insulating structure 43 and the stacked structure 34.

The selector element 102 illustrated in FIG. 1A and FIG. 1B may be formed on a lower side of the magnetoresistive element 101 or an upper side of the magnetoresistive element 101.

As described above, according to the present embodiment, the preliminary stacked structure 33 and the insulating structure 43 surrounding the preliminary stacked structure 33 are formed, and the upper layer part 15*b* of the storage layer 15 is formed in the hole 44 obtained by removing the second stacked portion 32 of the preliminary stacked structure 33. The thickness of the storage layer 15 can be made larger by this method. As a result, the magnetoresistive element including the thick storage layer 15 can be obtained, and the magnetoresistive element having a high thermal stability Δ based on shape anisotropy can be obtained.

Second Embodiment

Next, a second embodiment will be described. Since basic elements are the same as those of the first embodiment, and the descriptions of the elements explained in the first embodiment will be omitted.

FIG. 10 to FIG. 16 are cross-sectional views schematically illustrating a method of manufacturing a magnetic memory device of the present embodiment.

Figure 10:
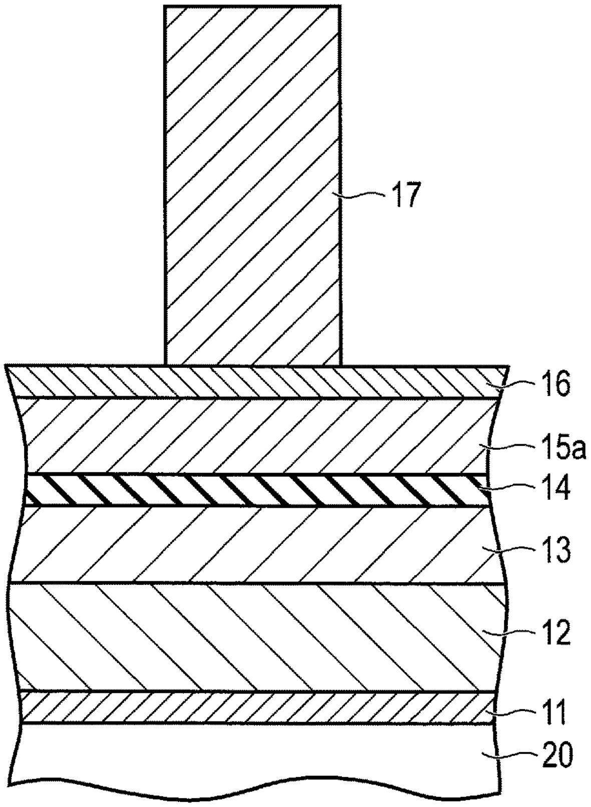
FIG. 10 is a cross-sectional view schematically illustrating in part a method of manufacturing a magnetic memory device according to a second embodiment.

First, as illustrated in FIG. 10, a stacked film including an under layer 11, a shift canceling layer 12, a reference layer (first magnetic layer) 13, a tunnel barrier layer (nonmagnetic layer) 14, a lower layer part 15*a* of the storage layer (second magnetic layer), and a cap layer 16 is formed, and a hard mask pattern 17 is formed on the cap layer 16 in the same manner as the step of FIG. 3 of the first embodiment.

Next, as illustrated in FIG. 11, the above stacked film is etched by using the hard mask pattern 17 as a mask in the same manner as the step of FIG. 4 of the first embodiment. A lower part 33*a* of a preliminary stacked structure is thereby formed. The lower part 33*a* of the preliminary stacked structure includes a first stacked portion 31 and a lower part 32*a* of a second stacked portion. The first stacked portion 31 includes the under layer 11, the shift canceling layer 12, the reference layer 13, the tunnel barrier layer 14, and the lower layer part 15*a* of the storage layer. The lower part 32*a* of the second stacked portion 32 includes the cap layer 16 and the hard mask pattern 17.

Next, as illustrated in FIG. 12, a lower part 43*a* of an insulating structure surrounding the lower part 33*a* of the preliminary stacked structure is formed in the same manner as the step of FIG. 5 of the first embodiment. The lower part 43*a* of the insulating structure includes a first insulating layer 41 and a lower part 42*a* of a second insulating layer. An upper surface of the lower part 33*a* of the preliminary stacked structure has substantially the same height as an upper surface of the lower part 43*a* of the insulating structure.

Next, as illustrated in FIG. 13, an upper part 33*b* (sacrificial layer 18) of the preliminary stacked structure is selectively formed on the lower part 33*a* of the preliminary stacked structure surrounded by the lower part 43*a* of the insulating structure. More specifically, a carbon nanotube layer is formed as the sacrificial layer 18. The sacrificial layer 18 can be selectively formed on the hard mask pattern 17 by using carbon nanotube as the sacrificial layer 18. The upper part 33*b* of the self-aligning preliminary stacked structure can be thereby formed on the lower part 33*a* of the preliminary stacked structure.

Next, as illustrated in FIG. 14, an upper part 43*b* of the insulating structure surrounding the upper part 33*b* of the preliminary stacked structure is formed on the lower part 43*a* of the insulating structure. That is, an upper part 42*b* of the second insulating layer is formed. More specifically, a silicon oxide film is deposited on the entire surface as the upper part 42*b* of the second insulating layer and further planarized, and the structure as illustrated in FIG. 14 is obtained. The preliminary stacked structure 33 surrounded by the insulating structure 43 can be thereby obtained. That is, the preliminary stacked structure 33 including the first stacked portion 31 and the second stacked portion 32 can be obtained.

Next, a hole 44 is formed by removing the second stacked portion 32 of the preliminary stacked structure 33 as illustrated in FIG. 15. More specifically, first, the sacrificial layer 18 (i.e., the upper part 33*b* of the preliminary stacked structure) is removed by $O_2$ asking. Next, the hard mask pattern 17 is removed in the same manner as the step of FIG. 6 of the first embodiment. Furthermore, the cap layer 16 is removed in the same manner as the step of FIG. 7 of the first embodiment. At this time, a part of the lower layer part 15*a* of the storage layer is also removed and the thickness of the lower layer part 15*a* of the storage layer is reduced.

Figure 16:
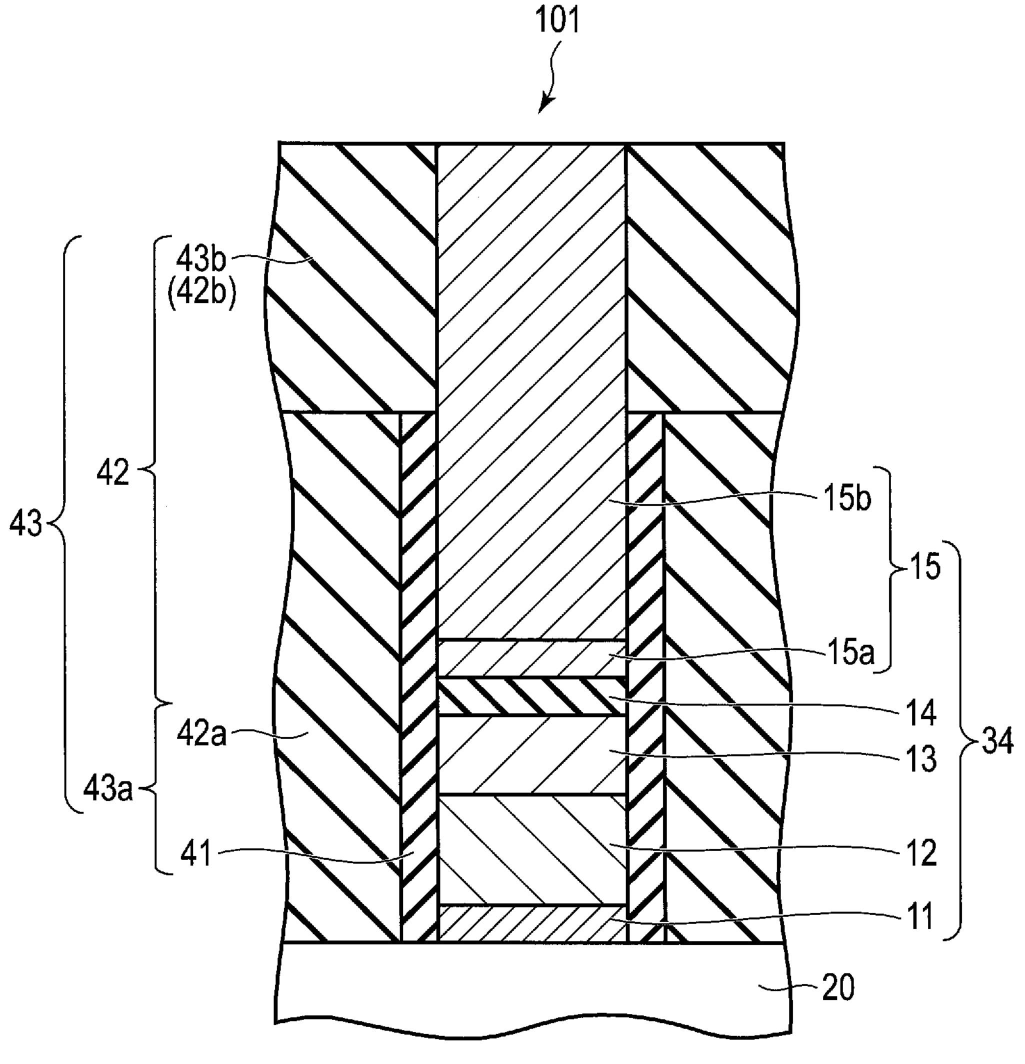
FIG. 16 is a cross-sectional view schematically illustrating in part a method of manufacturing a magnetic memory device according to a second embodiment.

Next, as illustrated in FIG. 16, an upper layer part 15*b* of the storage layer is formed in the hole 44 in the same manners as the steps of FIG. 8 and FIG. 9 of the first embodiment.

The stacked structure 34 of the magnetoresistive element 101 is thus formed in the insulating structure 43. The insulating structure 43 includes the first insulating layer 41 provided along a side surface of the stacked structure 34 and having an upper end located at a position lower than an upper end of the side surface of the stacked structure 34, and the second insulating layer 42 covering the first insulating layer 41 and having an upper end located at a position higher than the upper end of the first insulating layer 41. The stacked structure 34 includes the under layer 11, the shift canceling layer 12, the reference layer 13, the tunnel barrier layer 14, and the storage layer 15.

Subsequent steps are not illustrated, but bit lines and the like are formed on the insulating structure 43 and the stacked structure 34.

As described above, the magnetoresistive element including the thick storage layer 15 can be obtained, and the magnetoresistive element having a high thermal stability Δ based on shape anisotropy can be obtained, in the present embodiment, too, similarly to the first embodiment. In addition, in the present embodiment, the depth of the hole 44 can be made larger and the thickness of the storage layer 15 can be made larger since the upper part 33*b* of the preliminary stacked structure is formed on the lower part 33*a* of the preliminary stacked structure.

Third Embodiment

Next, a third embodiment will be described. Since basic elements are the same as those of the first and second embodiments, and the descriptions of the elements explained in the first and second embodiments will be omitted.

FIG. 17 is a cross-sectional view schematically illustrating a configuration of a magnetic memory device according to the present embodiment.

A basic structure and a basic manufacturing method of the magnetic memory device of the present embodiment are the same as those of the second embodiment. In the present embodiment, the upper layer part 15*b* of the storage layer 15 includes a part 15*b*1 formed of a nonmagnetic material and a part 15*b*2 formed of a magnetic material (ferromagnetic material). In other words, the storage layer 15 includes the first magnetic material part (lower layer part) 15*a* formed of a magnetic material (ferromagnetic material), the nonmagnetic material part 15*b*1 provided on the first magnetic material part 15*a* and formed of a nonmagnetic material, and the second magnetic material part 15*b*2 provided on the nonmagnetic material part 15*b*1 and formed of a magnetic material (ferromagnetic material).

Since the basic manufacturing method of the present embodiment is the same as the manufacturing method of the second embodiment, the second magnetic material part 15*b*2 can be made thicker than the first magnetic material part 15*a*. More specifically, the thickness of the second magnetic material part 15*b*2 is ten or more times as large as the thickness of the first magnetic material part 15*a*.

As described above, the magnetoresistive element including the thick storage layer 15 can be obtained, and the magnetoresistive element having a high thermal stability Δ based on shape anisotropy can be obtained, in the present embodiment, too, similarly to the first and second embodiments.

In addition, in the present embodiment, since the second magnetic material part 15*b*2 is ten or more times as thick as the first magnetic material part 15*a*, the value Δ of the first magnetic material part 15*a* can be set at approximately 30 and the value Δ of the second magnetic material part 15*b*2 can be set at approximately 80. Then, in the present embodiment, the first magnetic material part 15*a* and the second magnetic material part 15*b*2 are subjected to magnetic coupling via the nonmagnetic material part 15*b*1. In the present embodiment, since the storage layer 15 has such a configuration, saturation magnetization (Ms) can be made smaller and the write current can be reduced.

While certain embodiments have been described, these embodiments have been presented by way of example only, and are not intended to limit the scope of the inventions/present disclosures. Indeed, the novel embodiments described herein may be embodied in a variety of other forms; furthermore, various omissions, substitutions and changes in the form of the embodiments described herein may be made without departing from the spirit of the inventions/present disclosures. The accompanying claims and their equivalents are intended to cover such forms or modifications as would fall within the scope and spirit of the inventions/present disclosures.

What is claimed is:

1. A magnetic memory device comprising:

a stacked structure including a first magnetic layer having a fixed magnetization direction, a nonmagnetic layer provided on the first magnetic layer, and a second magnetic layer provided on the nonmagnetic layer and having a variable magnetization direction;

a first insulating layer provided along a side surface of the stacked structure, an upper end of the first insulating layer being located at a position lower than an upper end of a side surface of the second magnetic layer; and a second insulating layer covering the first insulating layer, an upper end of the second insulating layer being located at a position higher than the upper end of the first insulating layer.

2. The device of claim 1, wherein the second magnetic layer includes a first magnetic material part formed of a magnetic material, a nonmagnetic material part provided on the first magnetic material part and formed of a nonmagnetic material, and a second magnetic material part provided on the nonmagnetic material part and formed of a magnetic material.

3. The device of claim 2, wherein the second magnetic material part is thicker than the first magnetic material part.

4. The device of claim 2, wherein a thickness of the second magnetic material part is at least ten times as large as a thickness of the first magnetic material part.

5. The device of claim 1, wherein the first magnetic layer has perpendicular magnetization, and the second magnetic layer has perpendicular magnetization.

6. The device of claim 1, wherein the stacked structure forms a spin transfer torque (STT) magnetoresistive element.

* * * * *